(12) United States Patent
Shigeyoshi

(10) Patent No.: US 10,147,701 B2
(45) Date of Patent: Dec. 4, 2018

(54) WEDGE BONDING COMPONENT

(71) Applicant: Kyocera Corporation, Kyoto (JP)

(72) Inventor: Hidekazu Shigeyoshi, Hikone (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 0 days.

(21) Appl. No.: 15/546,693

(22) PCT Filed: Jan. 28, 2016

(86) PCT No.: PCT/JP2016/052498
§ 371 (c)(1),
(2) Date: Jul. 27, 2017

(87) PCT Pub. No.: WO2016/121873
PCT Pub. Date: Aug. 4, 2016

(65) Prior Publication Data
US 2018/0019224 A1 Jan. 18, 2018

(30) Foreign Application Priority Data
Jan. 29, 2015 (JP) .................................. 2015-015481

(51) Int. Cl.
*B23K 20/00* (2006.01)
*H01L 23/00* (2006.01)
(Continued)

(52) U.S. Cl.
CPC ............ *H01L 24/78* (2013.01); *B23K 20/004* (2013.01); *B23K 20/10* (2013.01); *B23K 20/233* (2013.01); *B23K 20/2333* (2013.01); *H01L 24/85* (2013.01); *B23K 2101/32* (2018.08); *B23K 2101/42* (2018.08); *B23K 2103/08* (2018.08); *B23K 2103/10* (2018.08); *B23K 2103/18* (2018.08); *B23K 2103/52* (2018.08); *H01L 24/45* (2013.01); *H01L 24/48* (2013.01); *H01L 2224/45005* (2013.01); *H01L 2224/45124* (2013.01); *H01L 2224/45144* (2013.01); *H01L 2224/45147* (2013.01); *H01L 2224/4847* (2013.01); *H01L 2224/78313* (2013.01); *H01L 2224/78321* (2013.01);
(Continued)

(58) Field of Classification Search
CPC .. B23K 20/005; B23K 20/004; B23K 20/007; B23K 20/025
USPC ........................................... 228/4.5, 49.6, 54
See application file for complete search history.

(56) References Cited

U.S. PATENT DOCUMENTS 5,844,194 A    12/1998   Kuwabara et al.

FOREIGN PATENT DOCUMENTS

| JP | H05206194 A | 8/1993 |
| JP | H0645389 A  | 2/1994 |

(Continued)

OTHER PUBLICATIONS

JP06-045389A computer english translation (Year: 1994).*

(Continued)

*Primary Examiner* — Erin B Saad
(74) *Attorney, Agent, or Firm* — Viering, Jentschura & Partner MBB

(57) ABSTRACT

There is provided with a surface for contacting a wire. At least a part of the surface comprises a surface of a ceramic sintered body containing aluminum oxide as a main ingredient and titanium carbide as an accessory ingredient.

6 Claims, 6 Drawing Sheets

(51) Int. Cl.
- *B23K 20/10* (2006.01)
- *B23K 20/233* (2006.01)
- *B23K 101/32* (2006.01)
- *B23K 101/42* (2006.01)
- *B23K 103/08* (2006.01)
- *B23K 103/10* (2006.01)
- *B23K 103/18* (2006.01)
- *B23K 103/00* (2006.01)

(52) U.S. Cl.
CPC ............... *H01L 2224/78353* (2013.01); *H01L 2224/78611* (2013.01); *H01L 2224/78621* (2013.01); *H01L 2924/00014* (2013.01)

(56) References Cited

FOREIGN PATENT DOCUMENTS

| | | | |
|---|---|---|---|
| JP | H06314721 | A | 11/1994 |
| JP | H07178568 | A | 7/1995 |
| JP | 2008078442 | A | 4/2008 |

OTHER PUBLICATIONS

International Search Report based on Application No. PCT/JP2016/052498 (1 Page) dated Apr. 26, 2016 (Reference Purpose Only).

\* cited by examiner

WEDGE BONDING COMPONENT

RELATED APPLICATIONS

The present application is a national stage entry according to 35 U.S.C. § 371 of PCT application No.: PCT/JP2016/052498 filed on Jan. 28, 2016, which claims priority from Japanese application No.: 2015-015481 filed on Jan. 29, 2015, and is incorporated herein by reference in its entirety.

TECHNICAL FIELD

The present disclosure relates to a wedge bonding component used for a wedge bonding apparatus for bonding a wire to a member to be bonded.

BACKGROUND

Conventionally, a wedge bonding apparatus has been used in connecting a wire to a member to be bonded. For example, in Patent Document 1, an example of a component used for a wedge bonding apparatus (wedge bonding component) is disclosed. In the example described in Patent Document 1, a tool tip portion that presses a conductive wire is constituted of a ceramic sintered body of at least one kind selected from silicon nitride, zirconia, sialon, silicon carbide, and alumina.

RELATED ART DOCUMENT

Patent Document

Patent Document 1: Japanese unexamined Patent Publication No. H7-178568

SUMMARY

The wedge bonding component of the disclosure has a surface for contacting a wire, wherein at least a part of the surface comprises a ceramic sintered body containing aluminum oxide as a main ingredient and titanium carbide as an accessory ingredient.

DETAILED DESCRIPTION

Recently, a wedge bonding component that less causes grain dropping and has higher durability has been required.

The wedge bonding component of the disclosure has a surface in contact with a wire, wherein at least a part of the surface comprises a ceramic sintered body containing aluminum oxide as a main ingredient and titanium carbide as an accessory ingredient. With this configuration, the wedge bonding component of the disclosure is high in durability. The main ingredient of a ceramic sintered body refers to an ingredient contained by an amount exceeding 50% by mass in a total 100% by mass of all ingredients constituting the ceramic sintered body.

Figure 1:
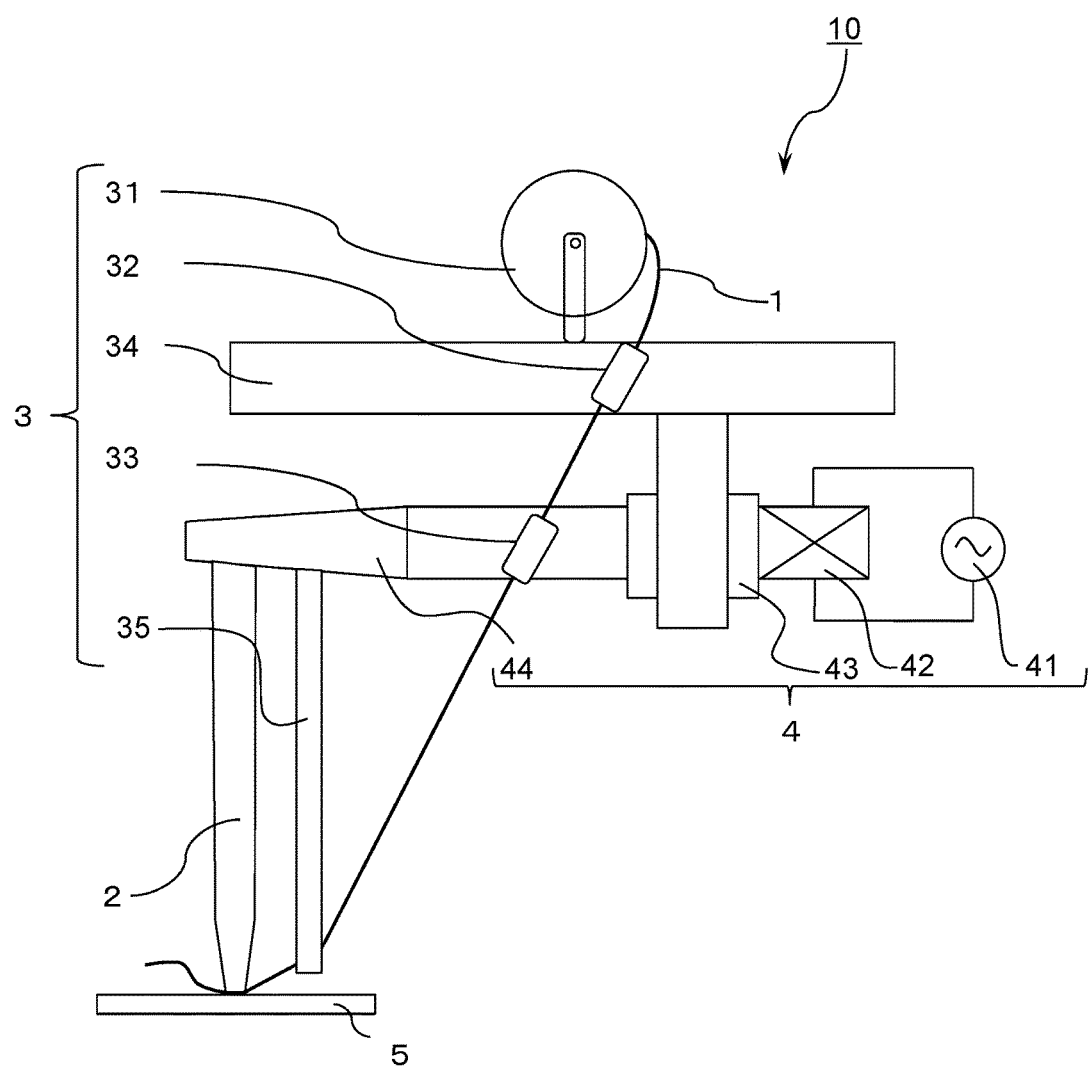
FIG. 1 is a schematic diagram showing an example of a skeleton framework of a wedge bonding apparatus provided with a wedge bonding component of an embodiment.
Figure 2:
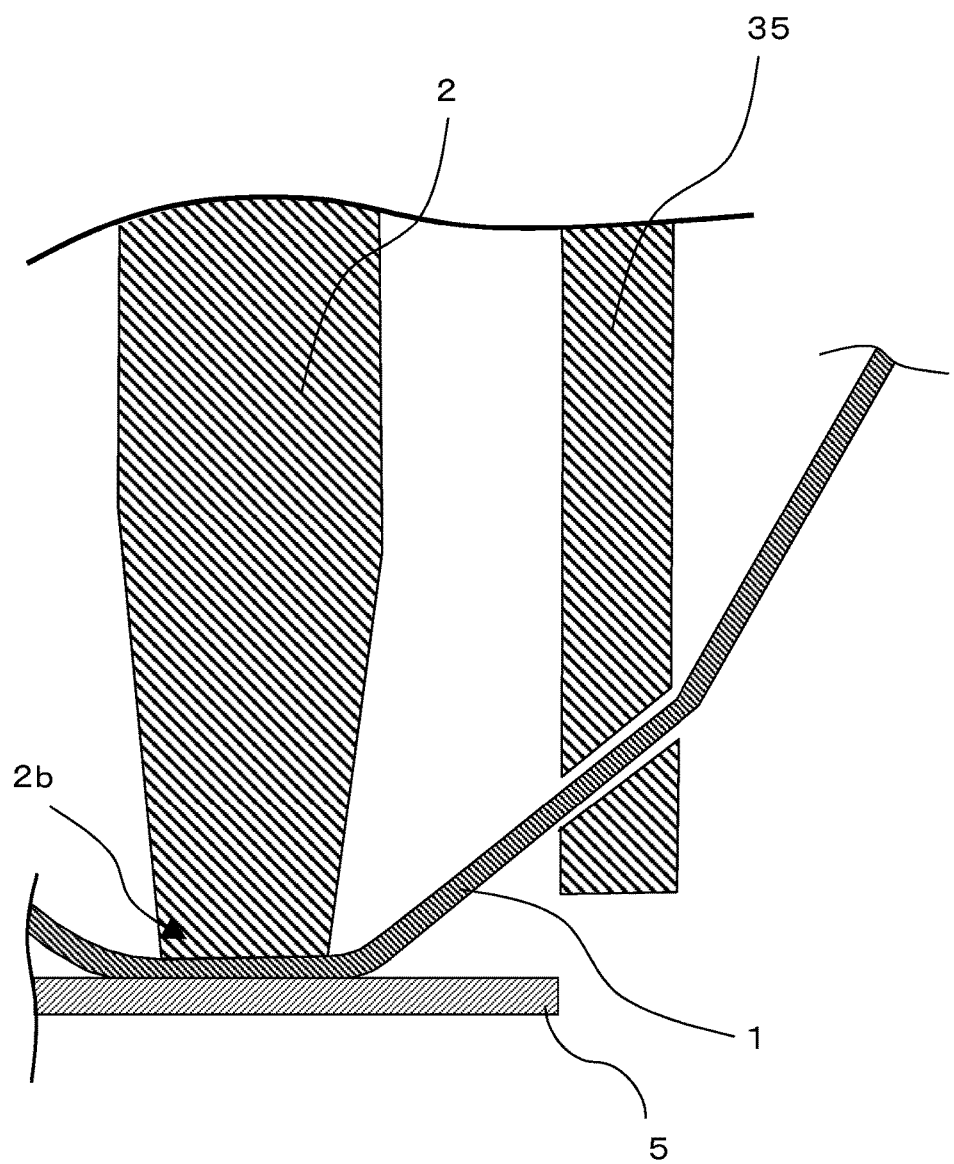
FIG. 2 is a schematic side view showing an essential part of a skeleton framework of the wedge bonding component shown in FIG. 1.
Figure 3:
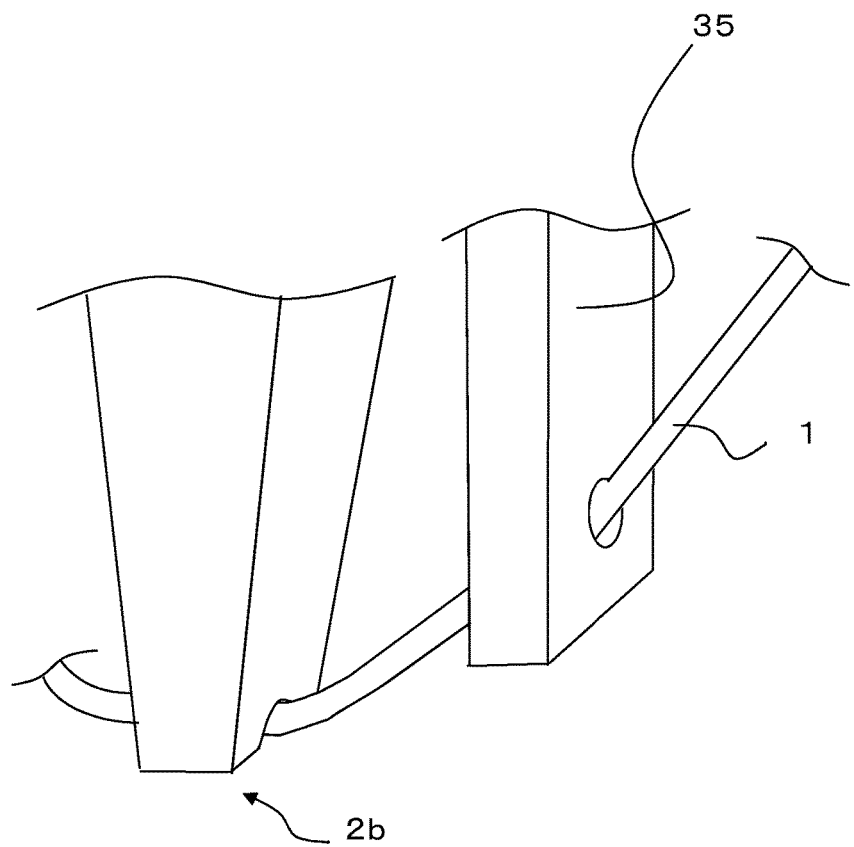
FIG. 3 is a perspective view of the wedge bonding component shown in FIG. 2.

The wedge bonding component of the disclosure will be described hereinafter in detail. FIG. 1 is a schematic diagram showing an example of a skeleton framework of a wedge bonding apparatus 10. FIG. 2 is an enlarged cross-sectional view showing part of wedge bonding apparatus 10 shown in FIG. 1. FIG. 3 is a perspective view corresponding to FIG. 2.

Wedge bonding apparatus 10 shown in FIG. 1 includes a bonding rod 2, a wire feed mechanism 3, a vibration transmission mechanism 4, and a pressure mechanism not shown.

The wire feed mechanism 3 feeds a wire 1 to the bonding rod 2. The vibration transmission mechanism 4 applies ultrasonic vibration to the bonding rod 2. The Pressure mechanism not shown applies a load to the bonding rod 2.

The bonding rod 2 imparts the load received from the pressure mechanism (not shown) and the ultrasonic vibration received from the vibration transmission mechanism 4. The wire 1 is bonded to a member 5 to be bonded placed on a circuit board (not shown) by this load and ultrasonic signal.

The wire feed mechanism 3 includes a drum 31, a first wire guide 32, a second wire guide 33, a support 34, and a wire clamp 35.

The drum 31 is fastened to support 34, and the wire 1 is wound around the drum 31. The first and second wire guides 32 and 33, each having a through hole through which the wire 1 is inserted, are placed along the path of the wire 1. FIG. 1 shows an example where the wire guides are placed between the drum 31 and the bonding rod 2.

The wire 1 is constituted of, for example, copper or aluminum having a diameter of 30 µm or more and 3 mm or less.

In the wedge bonding apparatus 10, the wedge bonding component of the disclosure is one that has a surface contacting the wire 1, and, in the example shown in FIG. 1, includes the bonding rod 2, the first wire guide 32, the second wire guide 33, and the wire clamp 35.

Figure 4:
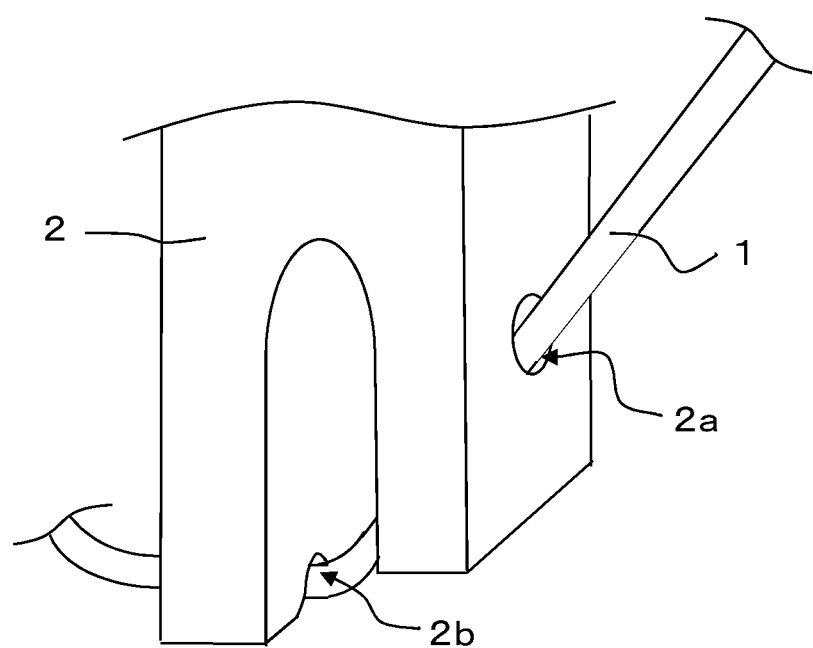
FIG. 4 is a perspective view showing another example of a bonding rod.
Figure 5:
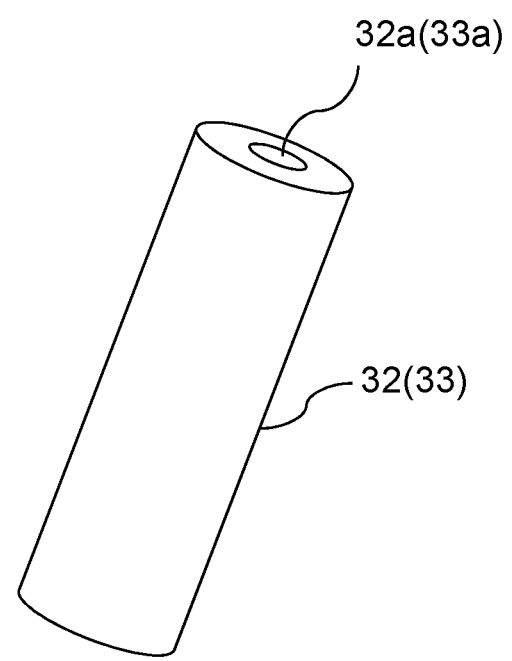
FIG. 5 is a perspective view showing another example of a wedge bonding component.

The bonding rod 2 may have a groove $2b$ for pressing wire 1 on its tip side as shown in FIGS. 3 and 4. The first wire guide 32 has a through hole $32a$ as shown in FIG. 5, and the second wire guide 33 has a through hole $33a$ as shown in FIG. 5. The wire 1 fed from the drum 31 passes through the through holes $32a$ and $33a$ to be led to the groove $2b$ of the bonding rod 2. During passing through the through holes $32a$ and $33a$, the wire 1 contacts the surfaces of the insides of the through holes $32a$ and $33a$.

The vibration transmission mechanism 4 includes an ultrasonic oscillator 41, a bolted Langevin-type transducer (hereinafter referred to as a BLT) 42, a cone 43, and a horn 44. The bonding rod 2 is fixed to the horn 44. An electric signal oscillated from the ultrasonic oscillator 41 is transformed to longitudinal ultrasonic vibration by BLT 42. This ultrasonic vibration is transformed to flexural vibration of the bonding rod 2 via the cone 43 and the horn 44, thereby causing ultrasonic vibration at the tip portion of the bonding rod 2. In FIG. 1, the first wire guide 32 is held on a side of a support 34, and the second wire guide 33 is held on a side of the horn 44.

The wire clamp 35 fixes the wire 1 when the wire 1 is to be cut after bonding. The wire clamp 35 is fastened to horn 44.

FIG. 4 is a perspective view of another embodiment of the bonding rod 2. The bonding rod 2 may have a through hole 2a as shown in FIG. 4 for feeding the wire 1 to the tip portion in a stable state. The wedge bonding component includes every component used in a portion on which the wire slides. The kind and shape of such a component is not particularly limited.

The wedge bonding component of this embodiment has a surface contacting a wire, wherein at least a part of the surface is constituted of a ceramic sintered body containing aluminum oxide as a main ingredient and titanium carbide as an accessory ingredient. Such a ceramic sintered body is high in hardness, rigidity, and mechanical strength (hereinafter, these properties are sometimes collectively referred to as mechanical properties). The ceramic sintered body has a content of aluminum oxide of more than 50% by mass and 80% by mass or less, and a content of titanium carbide of more than 20% by mass and less than 50% by mass, for example.

As a wire 1, aluminum wire and gold wire have been conventionally used. In these days, however, copper wire that costs low, has excellent conductivity, and has high energy saving performance is being increasingly used. Copper wire is high in melting point and work hardening coefficient compared with aluminum wire and gold wire. Therefore, there has been a problem that, with a wedge bonding component constituted of silicon nitride, zirconia, sialon, silicon carbide, and alumina, particles generated by wear and grain dropping increase during wedge bonding work, causing defects in semiconductor devices, etc. There has been another problem that, since such a wedge bonding component easily wears, the number of times of replacement increases.

In contrast to the above, the ceramic sintered body described above, which is excellent in mechanical properties, less causes wear, grain dropping, etc. even under contact and sliding of wire 1. Also, grain dropping, breakage, etc. are less caused by vibration during wedge bonding. Therefore, the wedge bonding component of this embodiment is low in replacement frequency even when it is repeatedly used over a long time.

In addition, when the wedge bonding component is the ceramic sintered body described above, which is nonmagnetic, it is hardly adsorbing magnetized dust. It is therefore possible to minimize occurrence of damage to the wire 1 caused by such dust.

The ceramic sintered body described above is also higher in conductivity than a silicon carbide sintered body that is known as exhibiting semiconductivity, for example. Therefore, the ceramic sintered body can be easily machined into a complicated shape by electrical discharge machining. In recent years, with the microminiaturization of the bonding size, the wedge bonding component is becoming increasing smaller in size and complicate in shape. In general, it is comparatively difficult to machine a ceramic sintered body into a small, complicated shape. However, the ceramic sintered body described above, being high in conductivity, can be easily machined into a complicated shape by electrical discharge machining. When the above-described ceramic sintered body is used to constitute the wedge bonding component, a wedge bonding component having a comparatively complicated shape can be manufactured at low cost.

The entire of the bonding rod 2, the first wire guide 32, and the second wire guide 33, not only at least a part of surfaces thereof contacting the wire 1, may be constituted of a ceramic sintered body containing aluminum oxide as a main ingredient and titanium carbide as an accessory ingredient.

The ceramic sintered body may have a content of titanium carbide of 30% by mass or more and 40% by mass or less. With such a content of titanium carbide of 30% by mass or more and 40% by mass or less, electrical discharge machining is easy due to high conductivity, thereby permitting response to a complicated shape. Also, in a sintering process, generation of minute air holes (e.g., air holes having a diameter of 100 nm to 500 nm) inside the ceramic sintered body is minimized, resulting in reduction in grain dropping.

The wedge bonding component of this embodiment may contain 0.01% by mass or more and 1% by mass or less of ytterbium in terms of an oxide. It is suitable that the content of ytterbium is 0.06% by mass or more and 0.2% by mass or less in terms of an oxide. An oxide of ytterbium is high in sinter promoting action. When the content of ytterbium is 0.06% by mass or more and 0.2% by mass or less in terms of an oxide, the mechanical strength can be enhanced while grain dropping accompanied by segregation of ytterbium is minimized.

Ingredients contained in the ceramic sintered body can be identified using an X-ray diffractometer. The content of each element contained in the ceramic sintered body can be determined with an X-ray fluorescence spectrometer or an inductively coupled plasma (ICP) emission spectrophotometer. More specifically, when aluminum oxide and titanium carbide are identified with an X-ray diffractometer, the contents of aluminum and titanium may be measured and then converted to those of an oxide ($Al_2O_3$) for aluminum and a carbide (TiC) for titanium.

The ceramic sintered body constituting the wedge bonding component of this embodiment may have an average crystal grain size of 0.1 μm or more and 0.9 μm or less. When the average crystal grain size is 0.1 μm or more and 0.9 μm or less, individual crystal grains are comparatively small, whereby dropping of comparatively large grains can be made difficult, and also the grain boundary phases are comparatively small in number, whereby thermal conductivity can be enhanced. When the thermal conductivity of the wedge bonding component is comparatively high, damage, etc. of wire 1 can be minimized even under excessive temperature rise.

The average crystal grain size may be determined in the following manner. First, an arbitrary surface of the ceramic sintered body is polished using diamond abrasive grains to form a mirror surface. This mirror surface is etched with phosphoric acid for several tens of seconds. The etched surface is then photographed using a scanning electron microscope (SEM). This photographing is performed over a range of 5 μm×8 μm, selecting an arbitrary position on the etched surface, with a magnification of about 10000×-13000×. The image obtained by photographing is referred to as a SEM image. The SEM image can be analyzed using an image analysis software called "Image-Pro Plus" (created by Media Cybernetics, Inc.), for example, to determine an average crystal grain size of the ceramic sintered body.

The contact surface of the ceramic sintered body with the wire 1 may have crystal grains of aluminum oxide protruding relative to crystal grains of titanium carbide. When the contact surface satisfies such a formation, crystal grains of aluminum oxide, which are lower in hardness than crystal grains of titanium carbide, are hard to damage wire 1. Also, since the wire 1 easily engages with crystal grains, displacement, etc. of the wire 1 is easily minimized. The average crystal grain size of aluminum oxide is 1.1 times or more and 2 times or less of the average crystal grain size of titanium carbide, for example.

The states of crystal grains of titanium carbide and crystal grains of aluminum oxide may be checked using a scanning electron microscope (SEM) and an energy dispersive spectrometer (EDS). For example, using SEM, a surface that is to be a contact surface may be observed for a state of protrusion with a magnification of 1000×-2000×, and identify an element constituting the protruding crystal grains with EDS. If the grains are aluminum oxide, oxygen and aluminum will be detected, and if they are titanium carbide, carbon and titanium will be detected.

Next, an example of a method for manufacturing the wedge bonding component of this embodiment will be described. First, powders of aluminum oxide, titanium dioxide, and titanium carbide are prepared. The proportions of these powders in the total of these powders as 100% by mass are 55% by mass or more and 75% by mass or less of aluminum oxide, 0.2% by mass or more and 10% by mass or less of titanium dioxide, and the remainder of titanium carbide. When the proportions are 60% by mass or more and 70% by mass or less of aluminum oxide, 0.2% by mass or more and 10% by mass or less of titanium dioxide, and the remainder of titanium carbide, for example, a ceramic sintered body having a content of titanium carbide of 30% by mass or more and 40% by mass or less can be obtained.

Titanium dioxide ($TiO_2$) functions as a sintering additive. As shown by reaction formula (1) below, titanium dioxide is reduced to titanium monoxide (TiO) by carbon monoxide. Titanium oxide is contained in a minute amount in a sintering atmosphere of argon, helium, neon, nitrogen, vacuum, or the like in the sintering process. Titanium monoxide (TiO) dissolves in titanium carbide (TiC) as a solid solution, as shown in reaction formula (2) below, to newly produce $TiC_xO_y$ ($x+y<1$ and $x \gg y$), where $x=0.85-0.9$ and $y=0.1-0.15$.

$$TiO_2 + CO \rightarrow TiO + CO_2 \qquad (1)$$

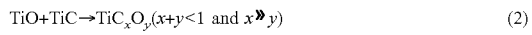

$$TiO + TiC \rightarrow TiC_xO_y (x+y<1 \text{ and } x \gg y) \qquad (2)$$

The produced $TiC_xO_y$ varies in density with the solid dissolved amount y of titanium oxide. The density of the ceramic sintered body is maximum when the solid dissolved amount y is 0.15.

Most of titanium dioxide added as a sintering additive change to $TiC_xO_y$. When $x=0.85-0.9$ and $y=0.1-0.15$, the average diameter of air holes in the ceramic sintered body can be less than 200 nm, and the area occupation of air holes in the ceramic sintered body can be less than 0.03%. The reason is that, by the resolution of titanium oxide in titanium carbide as a solid solution, generation of minute air holes inside is reduced. With x and y falling within the above ranges, generation of air holes having a diameter of 100 to 500 nm can be reduced, for example, and also coagulation of such air holes can be minimized.

To make the ceramic sintered body further compact, powder of at least one of ytterbium oxide, yttrium oxide, and magnesium oxide may be added at 0.06% by mass or more and 0.2% by mass or less. Such powder may be wet-blended using a barrel mill, a tumbling mill, a vibrating mill, a colloid mill, a bead mill, an attritor, a high-speed mixer, or the like, and pulverized into slurry. To obtain a ceramic sintered body containing ytterbium of a content of 0.06% by mass or more and 0.2% by mass or less in terms of an oxide, powder of ytterbium oxide may be 0.06% by mass or more and 0.2% by mass or less. The wet blending and pulverization of powder is preferably performed by putting beads for pulverization having a diameter of 2 mm or less in a bead mill.

To obtain a wedge bonding component where a ceramic sintered body has an average crystal grain size of 0.1 μm or more and 0.9 μm or less, comparatively small material powder may be used. For example, material powder having an average grain size of 0.08 μm or more and 0.59 μm or less may be used. To obtain such comparatively small material powder, beads for pulverization having a diameter of 0.4 mm or more and 1.5 mm or less may be used. Also, to obtain a wedge bonding component having a surface where crystal grains of aluminum oxide protrude relative to crystal grains of titanium carbide, beads for pulverization having a diameter of 0.5 mm or less may be used. The average crystal grain size of powder after pulverization may be determined by a so-called laser diffraction scattering method.

A forming auxiliary such as a binder and a dispersant is then added to the pulverized powder and mixed. After mixing, the powder is granulated using a tumbling granulator, a spray dryer, or a compression granulator, to obtain granules.

Thereafter, the obtained granules can be pressure-sintered to obtain a columnar or plate-like ceramic sintered body. The pressure sintering is performed, after the granules are charged into a forming die, in an atmosphere of argon, helium, neon, nitrogen, vacuum, or the like at a temperature of 1400-1700° C. under a pressure of 30 MPa or more. With a temperature of 1400-1700° C., sintering is prevented from becoming insufficient, so that, while crystal grains of titanium carbide are properly dispersed, abnormal grain growth of crystal grains of titanium carbide can be minimized. Also, with a pressure of 30 MPa or more, the compactness of the ceramic sintered body can be facilitated, so that comparatively high mechanical strength can be obtained.

During the pressure sintering, a shielding member including a carbonaceous material is preferably placed around the compact. This can minimize oxidation of titanium carbide and thus a ceramic sintered body excellent in mechanical strength can be provided.

After the pressure sintering, hot isostatic pressure sintering (HIP) may be performed as required. By performing hot isostatic pressure sintering (HIP), the mechanical strength can be further enhanced. For example, a wedge bonding component having a 3-point bending strength of 800 MPa or more can be obtained.

The ceramic sintered body is then machined into a desired shape using electrical discharge machining such as wire electrical discharge machining and diesinking electrical discharge machining. Mechanical working may be performed after electrical discharge machining as finishing. Finally, the surface may be buffed with diamond powder, etc.

Figure 6:
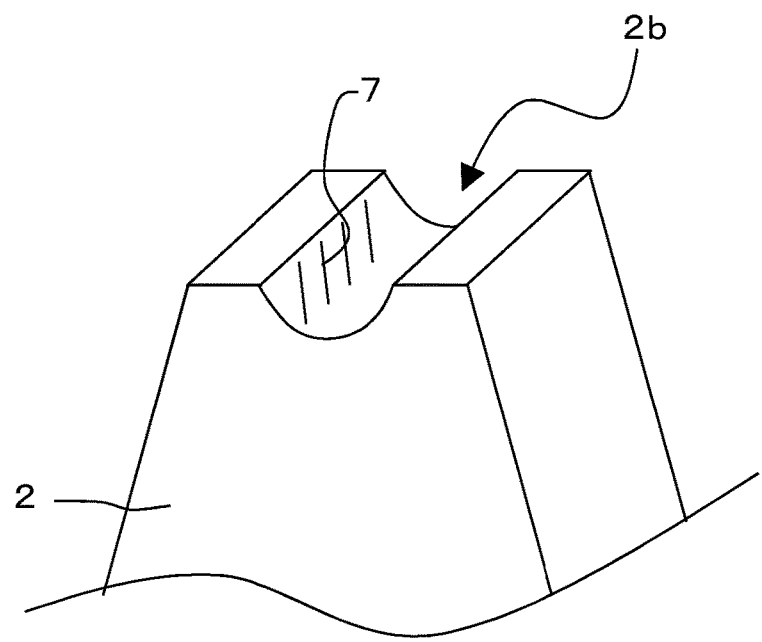
FIG. 6 is a perspective view of part of a tip face of a wedge rod.

For example, the groove 2b on the tip side of the bonding rod 2 may be formed by mechanical working using a flat-surface grinding machine. FIG. 6 is a partial enlarged perspective view of bonding rod 2. When the groove 2b is formed by mechanical working using a flat-surface grinding machine, etc., a plurality of projecting stripes 7, which are grinding traces by mechanical working, tend to be easily formed on the surface of groove 2b. Such projecting stripes 7 are preferably formed in an oblique direction with respect to the length direction of the groove 2b (i.e., the direction of sliding of the wire 1). For example, the angle formed between the groove 2b and the projecting stripes 7 is preferably in a range between 10° or more and 80° or less.

When the angle is 10° or more, the wire 1 resists sliding from the projecting stripes 7. When the angle is 80° or less, damage of the wire 1 can be minimized.

Examples of the wedge bonding component will be described hereinafter specifically. It should however be noted that the wedge bonding component is not limited to these examples.

EXAMPLE 1

First, powders of aluminum oxide, titanium dioxide, titanium carbide, and ytterbium oxide were prepared, and mixed so that the contents of these ingredients in a ceramic sintered body were values shown in Table 1. The powders were wet-blended and pulverized in a bead mill using beads for pulverization having a diameter of 1.5 mm, to obtain slurry.

A forming auxiliary such as a binder and a dispersant was then added to the pulverized powder and mixed. After mixing, the powder was granulated using a spray dryer, to obtain granules.

The obtained granules were charged into a forming die and then pressure-sintered. The pressure sintering was performed in a vacuum atmosphere at a temperature of 1600° C. under a pressure of 40 MPa at a temperature rise rate of 10° C./min for a holding time of 1 hour. Through these processes, obtained were a prism-shaped ceramic sintered body having a width of 4 mm, a thickness of 3 mm, and a height of 40 mm and a disk-shaped ceramic sintered body having a diameter of 152.4 mm and a thickness of 3 mm.

As comparative examples, manufactured were ceramic sintered bodies respectively having silicon nitride, zirconia, sialon, silicon carbide, and aluminum oxide as a main ingredient and having the shapes and sizes described above.

The compositions of ingredients constituting the samples were identified using an X-ray diffractometer. The amounts of elements of the samples were determined by an inductively coupled plasma (ICP) emission spectrophotometer. The compositions and amounts of the ingredients were shown in Table (Table 1 or 2).

The Vickers hardness, static modulus of elasticity, 3-point bending strength, and volume resistivity of each sample were measured in conformity with JIS R 1610: 2003 (ISO 14705: 2000 (MOD)), JIS R1602:1995, JIS R1601:2008 (ISO 14704:2000 (MOD)), and JIS C 2141:1992, respectively. The measured values were shown in Table.

For samples Nos. 1-11, the following evaluations were performed. First, 10 strip samples having a length of 70 mm, a width of 3 mm, and a thickness of 2 mm were cut out from a center portion of the disk-shaped ceramic sintered body of each sample. A slicing machine provided with a diamond blade was used for cutting. For each cut-out sample, the length of chipping generated on the cut surface was measured, and the maximum value thereof is shown in Table. This observation was performed using an optical microscope with a magnification of 400×. As the diamond blade, SD1200 was used, and the cutting was performed with this blade revolving at 10000 rpm, at a feeding speed of 100 mm/minute, and with an amount of each cut of 2 mm. As used herein, being comparatively small in maximum value of chipping is also referred to as being high in defectiveness, and being comparatively high in maximum value of chipping is also referred to as being low in defectiveness.

TABLE 1

| | Main ingredients | | Ingredients other than main ingredients | | | | | | |
|---|---|---|---|---|---|---|---|---|---|
| Sample No. | Ingredient | Content (percent by mass) | Ingredient | Content (percent by mass) | Ingredient | Content (percent by mass) | Ingredient | Content (percent by mass) |
| 1 | aluminum oxide | 74.9 | titanium carbide | 25 | ytterbium oxide | 0.1 | — | — |
| 2 | aluminum oxide | 69.9 | titanium carbide | 30 | ytterbium oxide | 0.1 | — | — |
| 3 | aluminum oxide | 63.95 | titanium carbide | 36 | ytterbium oxide | 0.05 | — | — |
| 4 | aluminum oxide | 63.94 | titanium carbide | 36 | ytterbium oxide | 0.06 | — | — |
| 5 | aluminum oxide | 63.9 | titanium carbide | 36 | ytterbium oxide | 0.1 | — | — |
| 6 | aluminum oxide | 63.87 | titanium carbide | 36 | ytterbium oxide | 0.13 | — | — |
| 7 | aluminum oxide | 63.83 | titanium carbide | 36 | ytterbium oxide | 0.17 | — | — |
| 8 | aluminum oxide | 63.8 | titanium carbide | 36 | ytterbium oxide | 0.2 | — | — |
| 9 | aluminum oxide | 63.7 | titanium carbide | 36 | ytterbium oxide | 0.3 | — | — |
| 10 | aluminum oxide | 59.9 | titanium carbide | 40 | ytterbium oxide | 0.1 | — | — |
| 11 | aluminum oxide | 54.9 | titanium carbide | 45 | ytterbium oxide | 0.1 | — | — |
| 12 | silicon nitride | 82 | yttrium oxide | 15 | magnesium oxide | 1.1 | iron silicide | 1.9 |
| 13 | zirconium oxide | 90 | iron oxide | 5 | yttrium oxide | 5 | — | — |
| 14 | sialon | 80.6 | aluminum oxide | 3.7 | yttrium oxide | 13.8 | iron silicide | 1.9 |
| 15 | silicon carbide | 99.91 | iron oxide | 0.05 | titanium dioxide | 0.04 | — | — |
| 16 | aluminum oxide | 99 | calcium oxide | 0.5 | silicon oxide | 0.3 | magnesium oxide | 0.2 |

TABLE 2

| Sample No. | Vickers hardness (GPa) | Static modulus of elasticity (GPa) | 3-point bending strength (MPa) | Volume resistivity (Ω · m) | Maximum value of chipping (μm) |
|---|---|---|---|---|---|
| 1 | 19.3 | 410 | 980 | $8 \times 10$ | 3 |
| 2 | 19.3 | 410 | 980 | $4 \times 10^{-1}$ | 3 |
| 3 | 19.3 | 410 | 960 | $1 \times 10^{-1}$ | 3 |
| 4 | 19.3 | 410 | 980 | $1 \times 10^{-1}$ | 3 |
| 5 | 19.3 | 410 | 980 | $1 \times 10^{-1}$ | 4 |
| 6 | 19.3 | 410 | 990 | $1 \times 10^{-1}$ | 4 |
| 7 | 19.3 | 410 | 990 | $1 \times 10^{-1}$ | 5 |
| 8 | 19.3 | 410 | 1000 | $1 \times 10^{-1}$ | 5 |
| 9 | 19.3 | 410 | 1000 | $1 \times 10^{-1}$ | 7 |
| 10 | 19.3 | 410 | 980 | $7 \times 10^{-2}$ | 10 |
| 11 | 19.3 | 410 | 980 | $4 \times 10^{-2}$ | 12 |
| 12 | 13.8 | 290 | 790 | $>1 \times 10^{12}$ | — |
| 13 | 12.3 | 210 | 980 | $1 \times 10^{11}$ | — |
| 14 | 14 | 300 | 1020 | $>1 \times 10^{12}$ | — |
| 15 | 21.6 | 430 | 540 | $1 \times 10^{3}$ | — |
| 16 | 15.2 | 360 | 270 | $>1 \times 10^{12}$ | — |

As shown in the tables, samples Nos. 1-11 each constituted of a ceramic sintered body containing aluminum oxide as a main ingredient and titanium carbide as an accessory ingredient are high in all of hardness, rigidity, and mechanical strength, compared with the other samples. A wedge bonding component constituted of a ceramic sintered body containing aluminum oxide as a main ingredient and titanium carbide as an accessory ingredient is high in durability and can reduce the replacement frequency. Also, samples Nos. 1-11 are all high in conductivity, and thus can be machined into a comparatively complicated shape by electrical discharge machining.

In samples Nos. 2-10, the content of titanium carbide in a ceramic sintered body contains 30% by mass or more and 40% by mass or less. Therefore, the conductivity of these samples is higher than that of sample No. 1 that has a content of titanium carbide of less than 30% by mass, and the defect resistance is higher than that of sample No. 11 that has a content of titanium carbide exceeding 40% by mass. From this, it can be said that samples Nos. 2-10 have both high conductivity and high defect resistance.

Among samples Nos. 3-9 that have the same content of titanium carbide, samples Nos. 4-8 have a content of ytterbium of 0.06% by mass or more and 0.2% by mass or less in terms of an oxide. Samples Nos. 4-8 are higher in mechanical strength than sample No. 3 that has a content of ytterbium of less than 0.06% by mass in terms of an oxide, and higher in defect resistance than sample No. 9 that has a content of ytterbium exceeding 0.2% by mass in terms of an oxide. From this, it can be said that samples Nos. 4-8 have both high mechanical strength and high defect resistance.

EXAMPLE 2

First, powders of aluminum oxide, titanium dioxide, titanium carbide, and ytterbium oxide were prepared, and mixed so that the contents of aluminum oxide, titanium carbide, and ytterbium oxide in a ceramic sintered body were 63.9% by mass, 36% by mass, and 0.1% by mass, respectively. The mixed powders were wet-blended and pulverized in a bead mill using beads for pulverization having diameters shown in Table 3, to obtain slurry.

Samples of disk-shaped ceramic sintered bodies were obtained by the same method as that shown in Example 1. Note that sample No. 23 is identical to sample No. 5 in Example 1.

The lengths of chipping were measured using the same method as that shown in Example 1, and the maximum values were shown in Table 3. As the diamond blade at this time, SD1200 was used, and the cutting was performed with this blade revolving at 10000 rpm, at a feeding speed of 120 mm/minute, and with an amount of each cut of 2 mm.

The thermal conductivity of each sample was measured in conformity with JIS R 1611:2010 (ISO 18575:2005 (MOD)), and the measured values were shown in Table 3.

An arbitrary surface of each sample was polished using diamond abrasive grains to form a mirror surface. This mirror surface was etched with phosphoric acid for several tens of seconds. An arbitrary position on the etched surface was then selected and photographed using a scanning electron microscope (SEM). This photographing was performed over a range of 5 μm×8 μm with a magnification of 10000×. The obtained SEM image was analyzed using an image analysis software called "Image-Pro Plus" (created by Media Cybernetics, Inc.) to determine an average crystal grain size of the ceramic sintered body. The resultant values were shown in Table 3.

TABLE 3

| Sample No. | Average bead grain size (mm) | Average crystal grain size (μm) | Thermal conductivity (W/(m · K)) | Maximum value of chipping (μm) |
| --- | --- | --- | --- | --- |
| 17 | 0.3 | 0.08 | 20 | 2 |
| 18 | 0.4 | 0.1 | 21 | 2 |
| 19 | 0.5 | 0.3 | 21 | 2 |
| 20 | 0.8 | 0.5 | 22 | 3 |
| 21 | 1 | 0.7 | 22 | 3 |
| 22 | 1.5 | 0.9 | 23 | 3 |
| 23 | 2 | 1 | 23 | 4 |

As shown in Table 3, samples Nos. 18-22 have average crystal grain sizes of 0.1 μm or more and 0.9 μm or less. Samples Nos. 18-22 are higher in thermal conductivity than sample No. 17 that has an average crystal grain size of less than 0.1 μm, and higher in defect resistance than sample No. 23 that has an average crystal grain size exceeding 0.9 μm. From this, it can be said that samples Nos. 18-22 have both high thermal conductivity and high defect resistance.

EXAMPLE 3

Using sample No. 20, the bonding rod 2 shown in the figures was formed. The formed bonding rod 2 was mounted in a wedge bonding apparatus 10 shown in FIG. 1 to be subjected to a bonding endurance test. As a comparative example, a so-called superhard bonding rod having tungsten carbide as a main ingredient was subjected to a similar endurance test. In the bonding rod of the example using sample No. 20, the wear volume was 30 μm or less even after 300,000-time repetition of bonding. In the bonding rod of the comparative example, the wear volume exceeded 100 μm at the stage of 100,000-time repetition of bonding. Durability significantly enhanced in the case of using sample No. 20 constituted of a ceramic sintered body containing aluminum oxide as a main ingredient and titanium carbide as an accessary ingredient, compared with the case of using the comparative example. The state of the tip face of the bonding rod was observed with a microscope after completion of 100,000 times of bonding. While a plurality of particles generated by wear had attached to the tip face of the comparative example, no particle was recognizable for the example using sample No. 20.

DESCRIPTION OF THE REFERENCE NUMERALS

1: Wire
2: Bonding tool
3: Wire feed mechanism
4: Vibration transmission mechanism
5: Member to be bonded
31: Drum
32: First wire guide
33: Second wire guide
34: Support
35: Wire clamp
41: Ultrasonic oscillator
42: Bolted Langevin-type transducer
43: Cone
44: Horn

What is claimed:

1. A wedge bonding component having a contact surface configured for contacting a wire, wherein
at least a part of the contact surface comprises a ceramic sintered body containing aluminum oxide as a main ingredient and titanium carbide as an accessory ingredient, wherein crystal grains of aluminum oxide protrude from the contact surface of said ceramic sintered body relative to crystal grains of titanium carbide.

2. The wedge bonding component according to claim 1, wherein
said ceramic sintered body contains 30% by mass or more and 40% by mass or less of titanium carbide.

3. The wedge bonding component according to claim 1, wherein
said ceramic sintered body contains 0.06% by mass or more and 0.2% by mass or less of ytterbium in terms of an oxide.

4. The wedge bonding component according to claim 1, wherein
said ceramic sintered body has an average crystal grain size of 0.1 μm or more and 0.9 μm or less.

5. The wedge bonding component according to claim 4, wherein
the crystal grains of aluminum oxide are on average 1.1 times or more larger than and 2 times or less smaller than the crystal grains of titanium carbide on average.

6. The wedge bonding component according to claim 1, wherein
said ceramic sintered body contains 50% by mass or more and 80% by mass or less of aluminum oxide.

\* \* \* \* \*